(12) United States Patent
Gangasani et al.

(10) Patent No.: US 8,286,042 B2
(45) Date of Patent: Oct. 9, 2012

(54) ON-CHIP SEED GENERATION USING BOOLEAN FUNCTIONS FOR LFSR RE-SEEDING BASED LOGIC BIST TECHNIQUES FOR LOW COST FIELD TESTABILITY

(75) Inventors: Swathi Gangasani, Bangalore (IN); Srinivasulu Alampally, Bangalore (IN); Divya Divakaran, Bangalore (IN); Rubin Ajit Parekhji, Bangalore (IN); Amit Kumar Dutta, Bangalore (IN); Srivaths Ravi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 381 days.

(21) Appl. No.: 12/710,081

(22) Filed: Feb. 22, 2010

(65) Prior Publication Data
US 2010/0218059 A1    Aug. 26, 2010

Related U.S. Application Data

(60) Provisional application No. 61/154,060, filed on Feb. 20, 2009.

(51) Int. Cl.
*G01R 31/28* (2006.01)
(52) U.S. Cl. ....... 714/728; 714/729; 714/736; 714/733; 714/738; 714/734; 714/724; 714/726; 714/732; 714/30; 714/32

(58) Field of Classification Search .................. None
See application file for complete search history.

(56) References Cited

U.S. PATENT DOCUMENTS

| | | | | |
|---|---|---|---|---|
| 5,471,482 A * | 11/1995 | Byers et al. | ............ | 714/719 |
| 5,925,144 A * | 7/1999 | Sebaa | ............ | 714/733 |
| 5,991,909 A * | 11/1999 | Rajski et al. | ............ | 714/729 |
| 6,662,327 B1 * | 12/2003 | Rajski | ............ | 714/738 |
| 6,807,646 B1 * | 10/2004 | Williams et al. | ............ | 714/736 |
| 6,950,974 B1 * | 9/2005 | Wohl et al. | ............ | 714/733 |
| 6,993,694 B1 * | 1/2006 | Kapur et al. | ............ | 714/733 |
| 7,260,760 B2 * | 8/2007 | Swaminathan | ............ | 714/738 |
| 7,421,629 B2 * | 9/2008 | Bucksch et al. | ............ | 714/718 |
| 2007/0078920 A1 * | 4/2007 | Crispin et al. | ............ | 708/250 |
| 2008/0077835 A1 * | 3/2008 | Khoche et al. | ............ | 714/733 |
| 2008/0201622 A1 * | 8/2008 | Hiew et al. | ............ | 714/718 |
| 2008/0235544 A1 * | 9/2008 | Lai et al. | ............ | 714/729 |

\* cited by examiner

*Primary Examiner* — John Trimmings
(74) *Attorney, Agent, or Firm* — Robert D. Marshall, Jr.; Wade James Brady, III; Frederick J. Telecky, Jr.

(57) ABSTRACT

This invention generates the random seed patterns using simple, low-area overhead digital circuitry on-chip. This circuit is implemented as a finite state machine whose states are the seeds as contrasted to storing the seeds in the prior art. These seeds are used to control pseudo-random pattern generation for built-in self-tests. This invention provides a large reduction in chip area in comparison with storing seeds on-chip or off-chip.

13 Claims, 6 Drawing Sheets

ON-CHIP SEED GENERATION USING BOOLEAN FUNCTIONS FOR LFSR RE-SEEDING BASED LOGIC BIST TECHNIQUES FOR LOW COST FIELD TESTABILITY

CLAIM OF PRIORITY

This application claims priority under 35 U.S.C. 119(e)(1) to U.S. Provisional Application No. 61/154,060 filed Feb. 20, 2009.

TECHNICAL FIELD OF THE INVENTION

The technical field of this invention is built-in self-test systems.

BACKGROUND OF THE INVENTION

Field tests of integrated circuits are becoming important for three main reasons. First, electronic components are increasingly used in safety critical systems such as automotive and medical electronics. Periodic testing of such safety critical systems is recommended through the lifetime of the device. Second, the user may need to check the operating parameters of the device during its use for conformance to specifications. This conformance may be improper due to design variability in deep sub-micron technologies. In addition various runtime environmental factors may change this conformance. Third, it is increasingly difficult to test for all defect models at time-zero manufacturing tests. Thus systems need to be monitored during their normal operation. These additional requirements are driven by the need for high dependability and low down-time in safety critical systems.

FIG. 1 illustrates an example of a built in self test (BIST) Architecture 100 known as a DBIST from Synopsys. In the Synopsys DBIST architecture, a linear feedback shift register (LFSR) based pseudo-random pattern generator (PRPG) 101 is initialized to a particular value or seed. The PRPG generates a new unique pattern each cycle of clock BIST_clk. The patterns generated are repeatable but appear random. This block functions as a pseudo-random pattern generator (PRPG). The patterns from the PRPG LFSR pass through a phase shifter 102. Phase shifter 102 is a block of combinational logic that converts the one-dimensional stream of pseudo-random patterns from PRPG 101 into a two dimensional array of values to load parallel scan chains of the circuit under test (CUT) 103.

As known in the art, such serial scan chains permit testing of the circuit under test as follows. Data is loaded into the registers of the circuit under test via the serial scan chains in a test mode. In the test mode each scan chain provides a serial path between an input, some of the data registers of the circuit under test and an output. Such an arrangement permits setting the conditions of the circuit under test into a desired state by scanning in the appropriate data. The set of parallel scan chains are generally designed to include registers storing data relevant to the internal condition of the circuit under test. After loading the data in this manner, the circuit under test operates in a normal mode responsive to its own clock signal (Core_Clk) for an interval. Following this operational interval the internal state of the circuit under test is output via the same scan chains. This view of the internal state of the circuit under test can be compared with an expected internal state.

In this prior art there are generally many scan chains. These scan chains are kept short to increase the controllability and observability of the design, reducing the pattern count. CUT 103 is run for an interval under clock Core_Clk. The scan chains capture data. Captured data is unloaded through scan chain outputs into a compactor 104 that compacts the test outputs. After 32 captures (known as one interval) in multiple-input signature register (MISR) 105, the state of the signature analyzer output via MISR_Scan_out is compared to the known signature of the fault free design. Any mismatch indicates that at least one erroneous value was unloaded from the scan chains. Multiple-input signature register (MISR) 105 is a modified LFSR. Compactor 104 is made of combinational logic. The signature analyzer is used to reduce the number of scan chain outputs allowing MISR 105 to be smaller. The test logic runs under control of BIST CTRL 106.

Traditional random pattern logic BIST with a single seed can result in only a finite set of care bits independent of circuit under test size. This limited set of care bits results in relatively low test coverage. DBIST such as illustrated in FIG. 1 addresses this problem by adopting periodic re-seeding technique. The initial and subsequent seeds are loaded from tester 110 to shadow register 107 via a shadow register scan in line. This seed is then transferred from shadow register 107 to PRPG 101 to start the test process. Thus in DBIST the seeds needed for the PRPG to generate test patterns are generated with deterministic automated test pattern generation (ATPG) techniques and loaded through tester channels.

The basic BIST architecture of FIG. 1 can be extended to support field self-test by providing enhancements like re-seeding through the device internal interface to the BIST controller, user programmable pattern counter for each seed, internal signature storage and comparison. FIG. 2 shows such modifications to the DBIST architecture illustrated in FIG. 1. Modified DBIST Architecture 200 illustrated in FIG. 2 is similar to FIG. 1. Like parts include like reference numerals. Under control of central processing unit (CPU) 210 self-test controller 211 controls use of external/internal memory 212. Self-test controller 211 periodically loads a new seed from external/internal memory 212 into shadow register 107 via shadow register scan-in to begin a new series of tests.

When logic BIST is employed for field-test, the seeds generally are stored on-chip. During self-test these seeds are periodically loaded into the LFSR to generate the patterns. To attain a desirable level of coverage may require a large number of seeds. This would require a large on-chip memory. Field tests using these traditional logic BIST techniques thus generally suffer from either low coverage or large overhead from the required on-chip memory for seed storage. An alternate to providing a large internal memory has the seeds transferred to the device from an external memory. This requires either no field test or a system level interface between the CUT and external memory requiring additional hardware and software support.

SUMMARY OF THE INVENTION

This invention enables of high test coverage during in-system test of digital logic using logic BIST (built-in self-test) techniques using LFSR (linear feedback shift register) based re-seeding, without the need for storing seeds in an on-chip memory.

This invention generates the desired random seed patterns using simple, low-area overhead digital circuitry on-chip. This circuit is implemented as an FSM (finite state machine) whose states are the seeds, wherein $Seed_{next}$=Function ($Seed_{present}$). Simple arithmetic functions amenable for implementation via simple FSMs are used. This contrasts the prior art approach of storing the seeds in an on-chip memory.

In one example implementation, the invention reduces the area required for seed generation from 12K gate equivalents to just 400 gates.

This invention has five advantages. First, it obtains high test coverage during field self-test as compared to conventional logic BIST. Second, this invention can be used for high speed production testing to cover both stuck-at faults using slow speed clocks and delay faults using at-speed internal PLL based clocks, without dependence on the external tester infrastructure and slow tester communication channels. This potentially improves test quality as well saves test time. Third, the coverage obtained in the field is no longer restricted by the available on-chip memory or the available system level interface for seed transfer from external memory into the CUT. Fourth, the CUT design for test (DFT) architecture can be made independent of the tester architecture with respect to the number of tester channels available for re-seeding or the tester channel and device I/O shift speeds. In fact, the CUT can now be tested in the fastest possible way. Fifth, this invention provides a huge reduction in chip area in comparison with storing seeds on-chip or off-chip because these seeds are now generated using an FSM.

BRIEF DESCRIPTION OF THE DRAWINGS

These and other aspects of this invention are illustrated in the drawings, in which.

DETAILED DESCRIPTION OF PREFERRED EMBODIMENTS

Field test using logic BIST is commonly employed in safety critical applications. Logic BIST is implemented using LFSRs as pseudo-random pattern generators (PRPG) and a multiple input signature register (MISR) as response compactors. LFSR techniques suffer from low coverage due to pseudo-random patterns. To improve the coverage obtained by traditional LFSR based BIST, re-seeding techniques are used wherein the LFSR is periodically seeded (initialized) to generate a new set of patterns. Re-seeding is effective to obtain high coverage, similar to that obtained using deterministic patterns obtained using ATPG (automatic test pattern generation) techniques. This incurs associated costs of prior seed generation and seed storage on-chip when logic BIST is employed for field test. As a result, field test using traditional logic BIST techniques suffers from either low coverage or has the overhead of requirement of on-chip memory for seed storage. A large number of seeds are often required to obtain high coverage, thereby requiring a large memory. To avoid such an internal memory, the traditional approach transfers seeds to the device from an external memory. This technique of the prior art is either not amenable to field test or requires a system level interface between CUT and external memory requiring additional hardware and software support.

This invention overcomes both these limitations. This invention employs re-seeding to improve coverage using a compact FSM structure as an internal seed re-generation mechanisms rather than using internal memory for seed storage. This invention of internal seed generation using an internal FSM enables the test of the CUT stand-alone without the need for either any system level interfaces or hardware/software to support seed transfer from external memory into the device.

Using this invention field tests can be performed easily independent of the system configuration. In this invention test coverage is no longer limited by the available on-chip memory.

This invention is an efficient scheme which avoids the overhead of storing large number of seeds on-chip. This invention includes an internal re-seeding mechanism using a compact finite state machine (FSM). A single seed is stored on-chip. The rest of the seeds are generated on-chip by performing simple arithmetic/logic functions on a prior seed. This replaces the memory required to store seeds with simple logic gates at a much lower silicon cost without any major loss in coverage.

Figure 1:
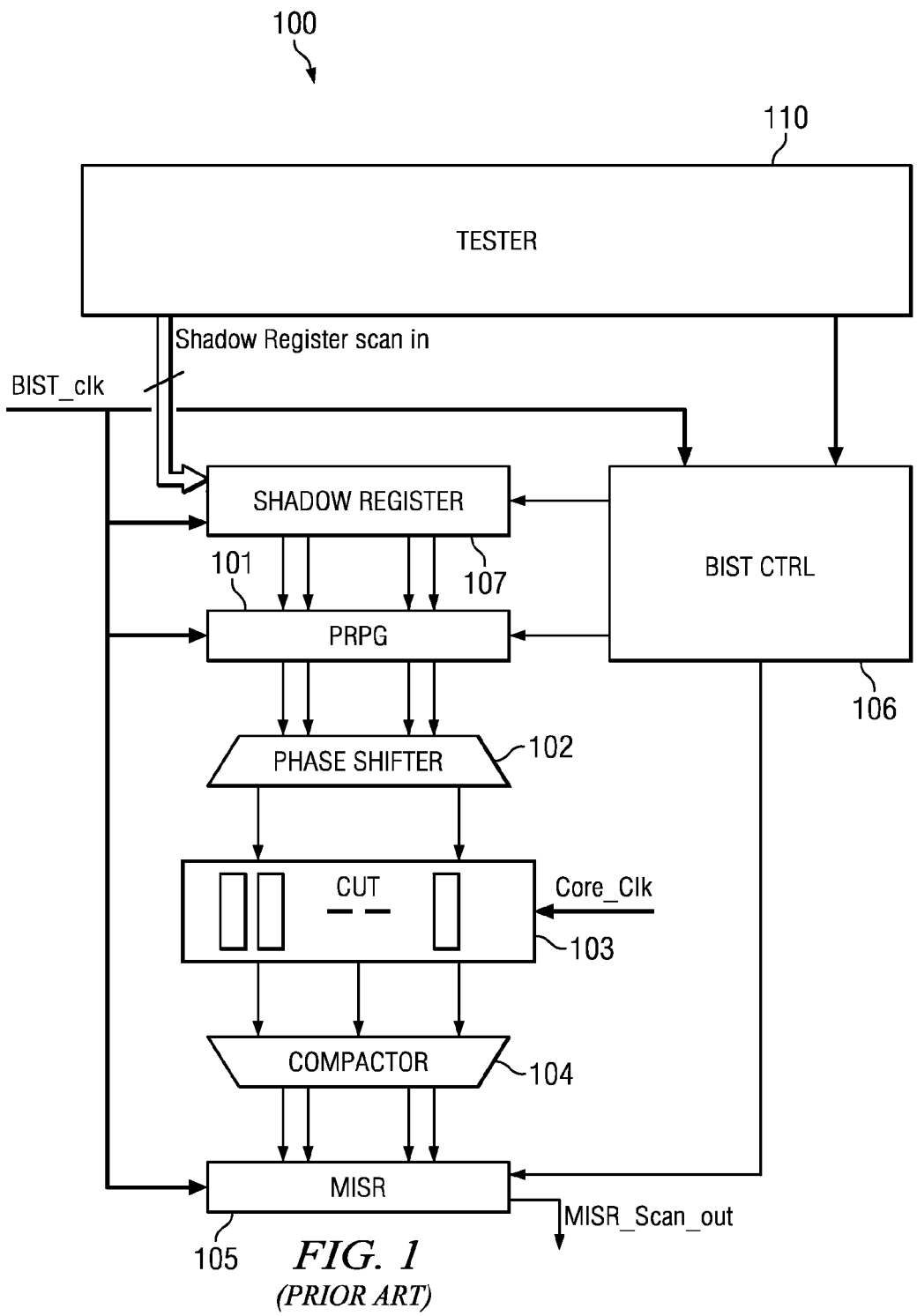
FIG. 1 illustrates an example of a built in self test (BIST) Architecture known as a DBIST (prior art)
Figure 3:
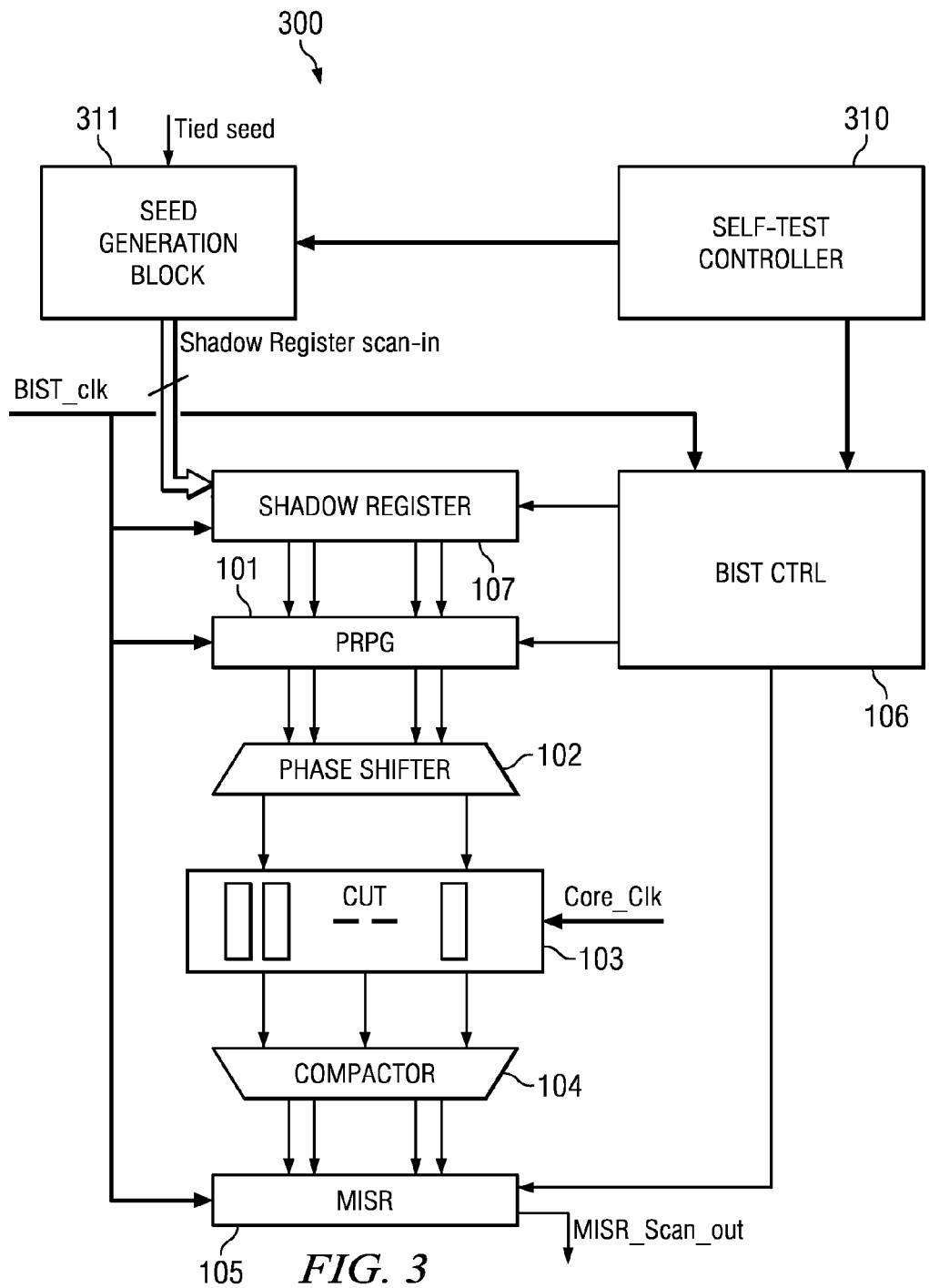
FIG. 3 illustrates the interface of seed generation logic of this invention with field self-test logic.

This invention enables stand-alone test of the CUT without either needing any system level interface or needing any hardware and software to support seed transfer from external memory. FIG. 3 illustrates the interface of seed generation logic of this invention with field self-test logic. BIST Architecture 300 illustrated in FIG. 3 is similar to FIG. 1. Like parts include like reference numerals. Self-test controller 310 controls seed generation block 311. Self-test controller 310 periodically loads a new seed from seed generation block 311 into shadow register 107 via shadow register scan-in to begin a new series of tests.

Figure 2:
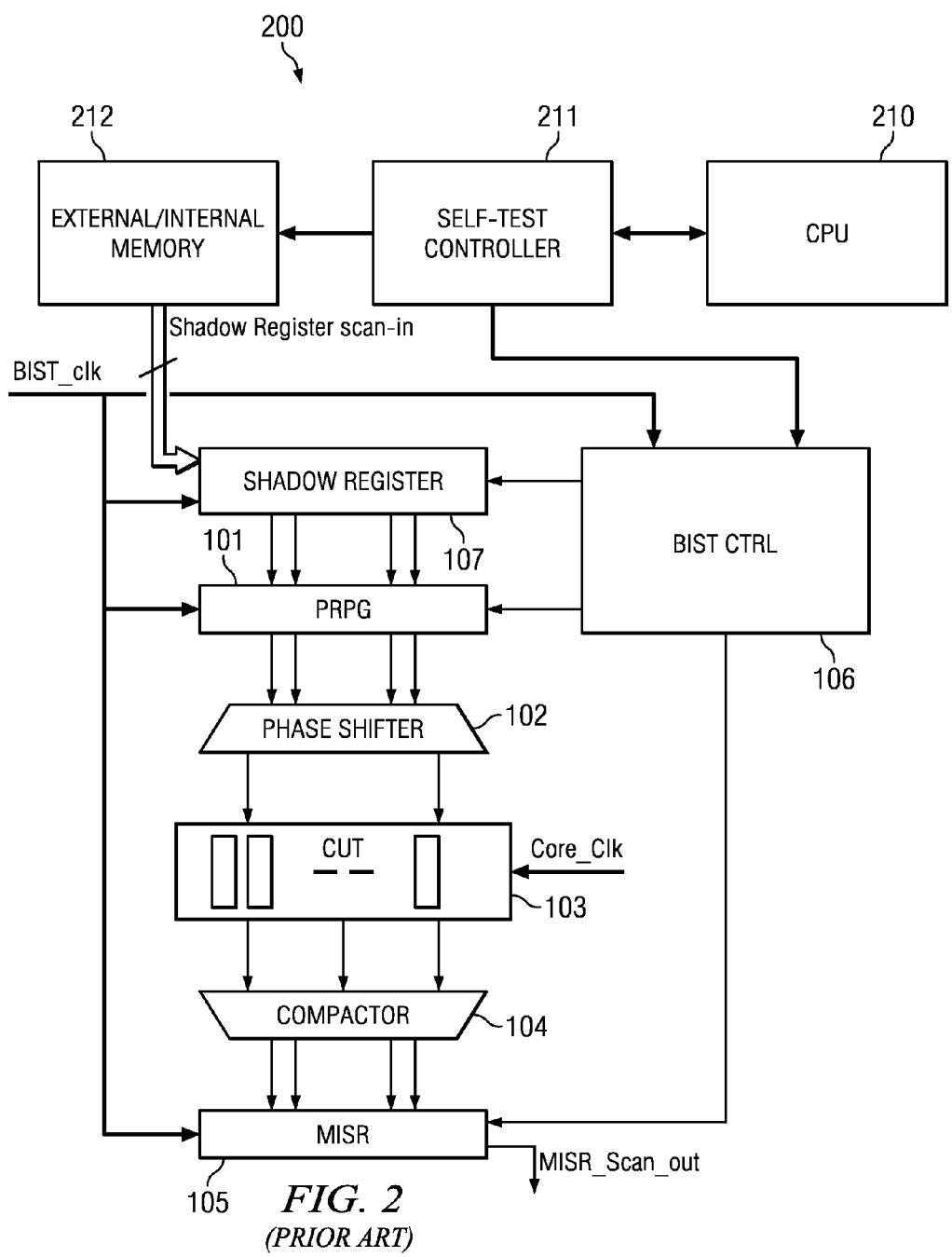
FIG. 2 shows such modifications to the DBIST architecture illustrated in FIG. 1 (prior art)

The seed generation logic may also be implemented in software for a zero-overhead implementation on a central processing unit such as CPU 210 (FIG. 2). This embodiment requires the CPU executing this software to be off-scan. Thus the CPU can generate the seeds when required by self-test controller 310. This is a viable embodiment in multi-processor chips, where a processor performing seed generation can be off-scan in one test mode. This seed generation processor can be tested in another test mode with another processor being responsible for seed generation during this further test mode.

Figure 4:
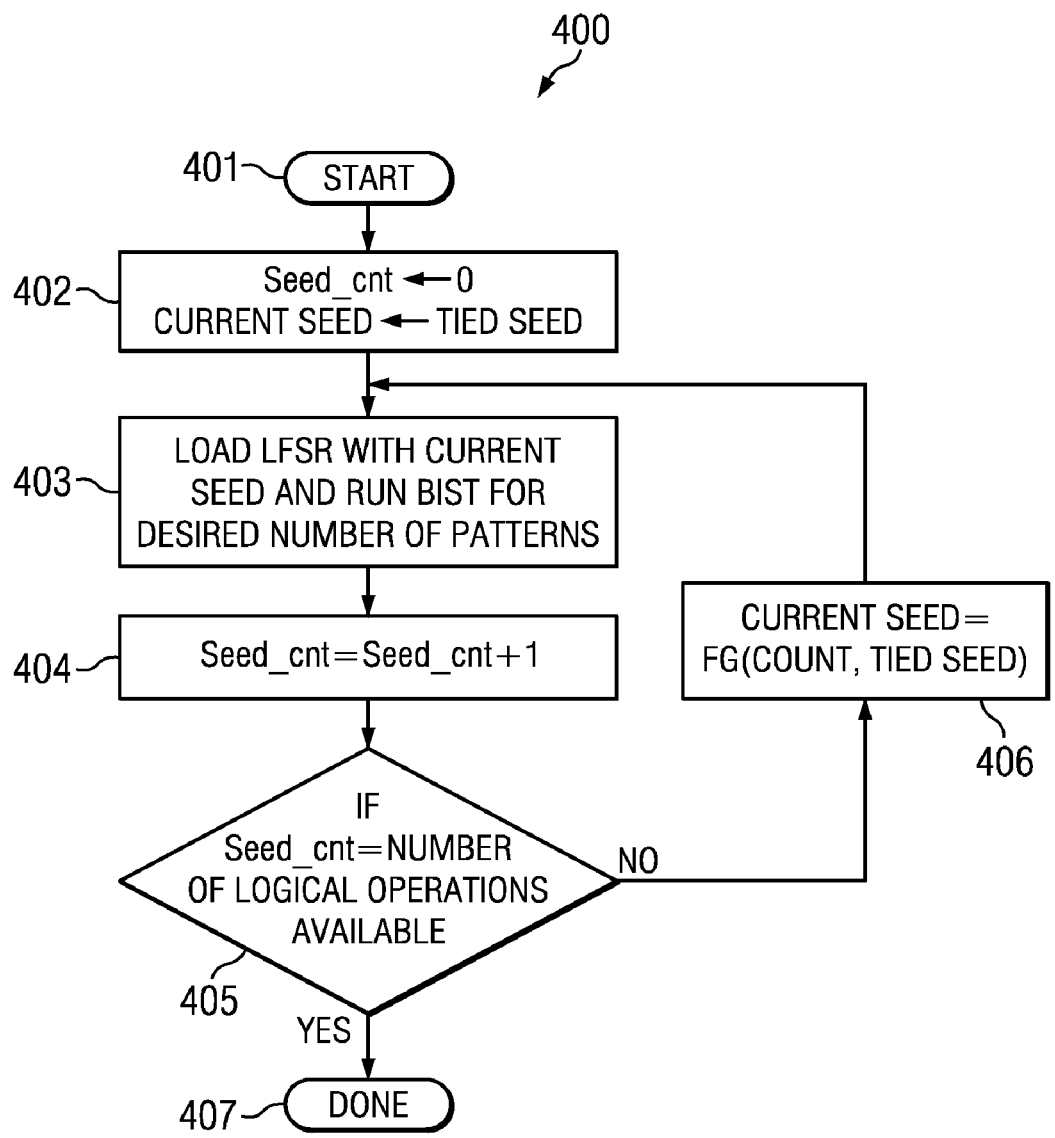
FIG. 4 is a flow chart illustrating operation of the seed generating block.

FIG. 4 is a flow chart 400 illustrating operation of the seed generating block 311. Flow chart 400 begins with start block 401. Block 402 initializes variables Seed_cnt and Current Seed. Seed_cnt is the number of seeds generated. Current Seed is the seed used to generated the current test vectors in PRPG 101. Block 402 initializes Seed_cnt to zero. Block 402 initializes Current Seed to Tied Seed. Tied seed is a seed stored on-chip for generating the other seeds via logical/arithmetic operations.

Block 403 loads the LFSR with the current seed and runs the BIST. This involves using PRPG 101 to generate test vectors for CUT 103 and accumulating the results in MISR 105. Block 404 increments the variable Seed_cnt.

Test block 405 determines if the variable Seed_cnt equals the number of logic operations available in seed generation block 311. If these are not equal (No at test block 405), then block 406 causes seed generation logic 311 to generate a new Current Seed. In accordance with this embodiment of the invention, the new Current Seed is a function of the tied seed and Seed_cnt. Block 406 returns control to block 403 which loads the new Current Seed into LFSR and begins a new BIST. The implementation of this new seed generation is explained below.

Figure 5:
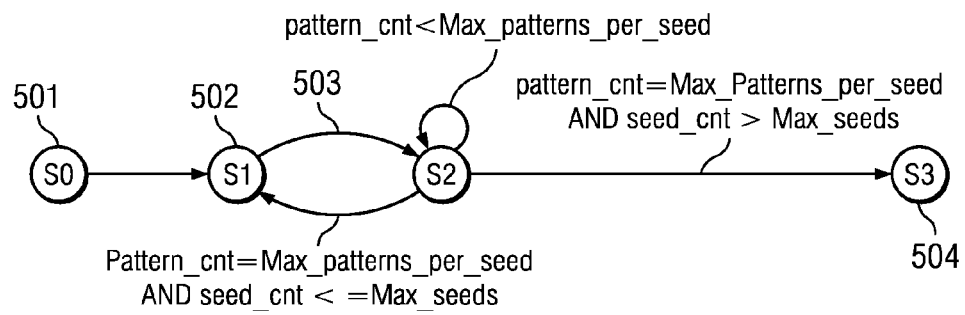
FIG. 5 illustrates four states of the field self-test of this invention.

FIG. 5 illustrates four states of the field self-test. The operations performed in each state are listed in Table 1.

TABLE 1

| State | Function |
|---|---|
| S0 | Start FSM, seed_cnt = 0 |
| S1 | Load LFSR with current seed, seed_cnt++, pattern_cnt = 0 |
| S2 | Generate patterns with loaded seed, pattern_cnt++ |
| S3 | Compare MISR |

The start of self-test is state S0 501. In state S0 501 the finite state machine (FSM) starts and the value of the seed counter seed_cnt is reset to zero. Function generator FG generates a new seed based on the values of tied_seed and seed_cnt. For the first seed when seed_cnt=0, tied_seed is loaded into the LFSR. Following the processing of state S0 501 the self-test automatically enters state S1 502. In state S1 502, the LFSR generates patterns with the loaded seed and those patterns are loaded into the circuit under test. Following the processing of state S1 502 the self-test automatically enters state S2 503. During state S2 503 the tests take place with a variable pattern_cnt incremented upon generation of each new pseudo-random pattern. When the number of patterns equals the number of patterns per seed (pattern_cnt=Max_patterns_per_seed), the self test leaves state S2 503 and re-enters state S1 502. In this and subsequent entry into state S1 501, seed_cnt is incremented. This new seed generated with the seed_cnt is loaded into the LFSR. Following the processing of state S1 502 the self-test automatically enters state S2 503. This sequence of operations between states S1 502 and S2 503 is repeated till the seed_cnt equals the maximum number of seeds (Max_seeds). Upon this event self test leaves state S2 503 and enters state S3 504. Upon entering state S3 504, the updated MISR is compared with the stored golden MISR and a pass/fail signal issues.

Figure 6:
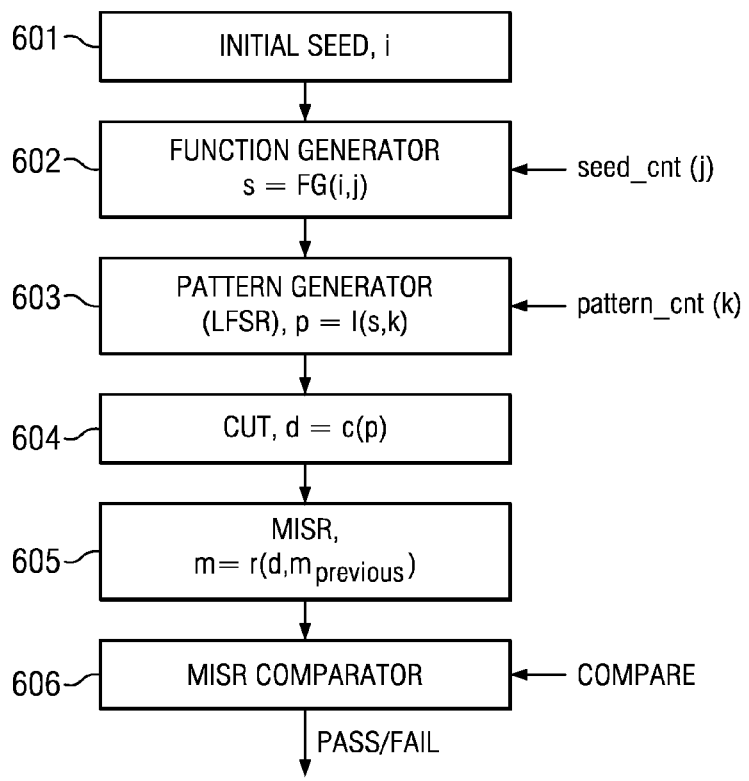
FIG. 6 illustrates the data-path of the seed generation of this invention.

FIG. 6 illustrates the data-path of the seed generation application. Step 601 receives the initial seed i. In step 602 the function generator generates the new seed. In step 603 the pseudo-random pattern generator generates the test vector p. Step 604 applies the test vector to the CUT and obtains results c. In step 605 the MISR accumulates the previous results data. In step 606 the current MISR data is compared with the expected data.

This invention involve minimal area overhead in generating the seeds. The following is an example embodiment using 9 simple logic operations to be performed on the initially stored seed. This example begins with an initially stored 32-bit seed of "00110011 11111111 10101010 00001111."

1. Reversing the entire seed.
   New_seed[i]=Original_seed[Size_of_LFSR-i-1], where New_seed[i] is the bit in the $i^{th}$ position of generated seed.
   New seed=11110000 01010101 11111111 11001100
2. Swapping first half and the second half of the seed.
   New_seed[i]=Original_seed[Size_of_LFSR/2+i].
   New seed=10101010 00001111 00110011 11111111
3. Rotating the seed (left) by one bit position.
   New_seed[i]=Original_seed[i-1] and New_seed[0]=Original_seed[Size_of_LFSR-1].
   Note: LFSR rotates itself during operation to the right, hence this rotation is in the opposite direction.
   New seed=01100111 11111111 01010100 00011110
4. Grey coding (ExOR-ing adjacent bits leaving MSB).
   New seed=00101010 00000000 01111111 00001000
5. ExNOR-ing adjacent bits.
   New_seed[i]=(Original_seed[i]) XNOR (Original_seed[i+1]).
   New seed=10101011 11111111 00000001 11101111
6. Rotating seed (left) by two bits.
   New_seed[i]=Original_seed[i-2].
   New_seed[1]=Original_seed[Size of LFSR-1].
   New_seed[0]=Original_seed[Size of LFSR-2].
   New seed=11001111 11111110 10101000 00111100
7. Swapping adjacent bits.
   Swap $i^{th}$ bit and $(i+1)^{th}$ bit, swap $(i+2)^{th}$ bit and $(i+3)^{th}$ bit and so on.
   New seed=00110011 11111111 01010101 00001111
8. Swapping alternate bits.
   Swap $i^{th}$ bit and $(i+2)^{th}$ bit, swap $(i+3)^{th}$ bit and $(i+5)^{th}$ bit and so on.
   New seed=10101011 11111110 10111000 00010111
9. Swapping first byte and second byte, third byte and fourth byte and so on, starting from MSB
   For an N bit seed, swap bits N to N-7 and bits N-8 to N-15, swap bits N-16 to N-23 and bits N-24 to N-31 and so on.
   New seed=11111111 00110011 10101010 00001111

Listing 1

These operations chosen for minimal area overhead in implementing them. These functions can be realized with one level of simple gates and area implementation details on GTECH library are listed in Table 2. Table 2 compares the area of storing external seeds in on chip memory and area of seed generation using an FSM on this sample design with single DBIST CoDEC.

TABLE 2

| Method | Coverage | Area (Standard 2i/p NAND Gate Area) |
|---|---|---|
| External seeds using memory storage | 87.95% | 12K |
| Seed Generating Using an FSM | 87.35% | 700 |

Figure 7:
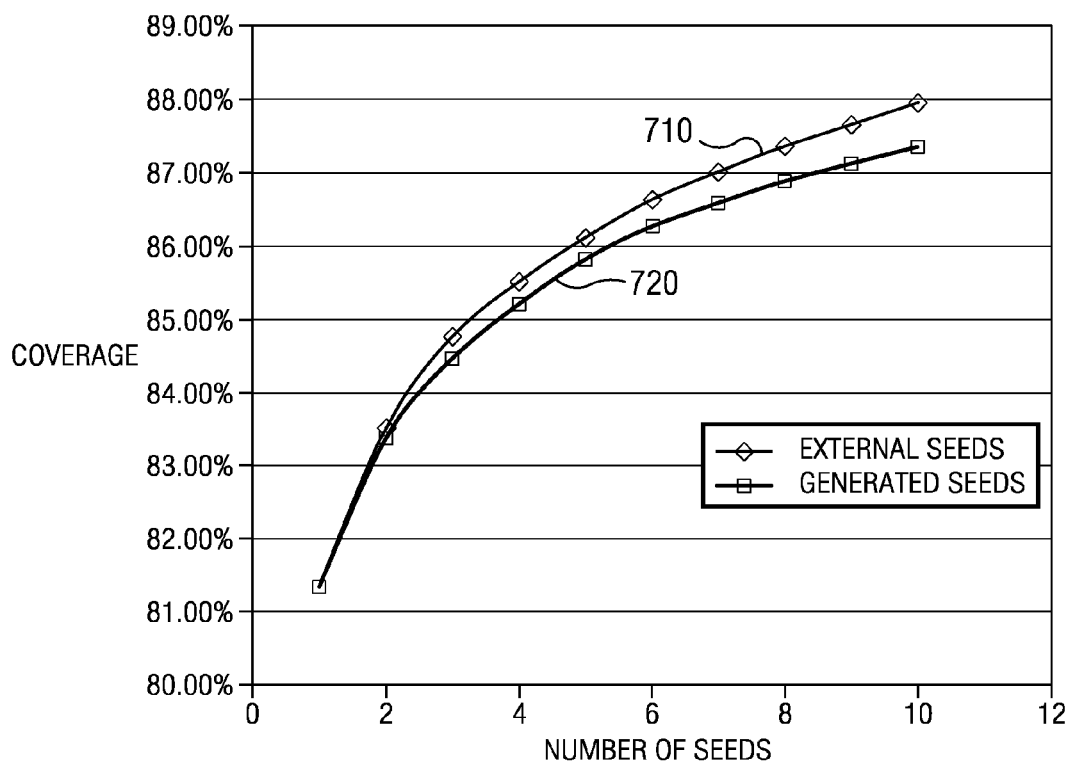
FIG. 7 compares coverage results for on-chip seed generation of the current invention versus stored external seeds for an exemplary design A.
Figure 8:
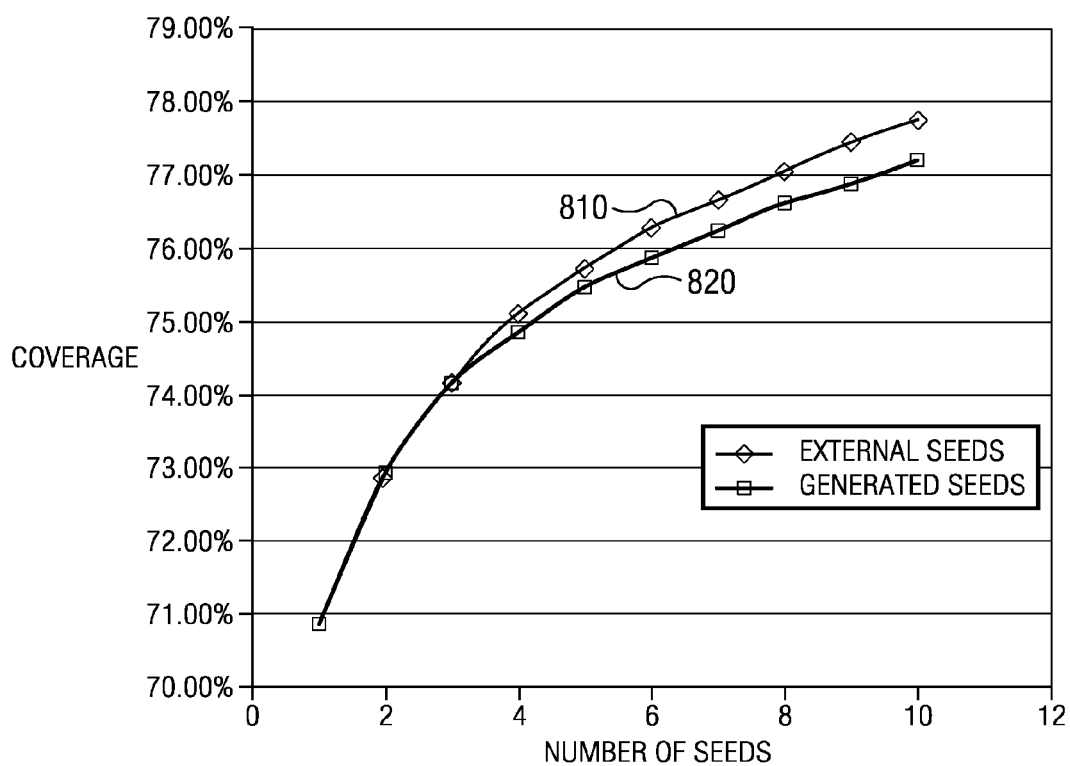
FIG. 8 compares coverage results for on-chip seed generation of the current invention versus stored external seeds for an exemplary design B.

FIGS. 7 and 8 compare coverage results for on-chip seed generation of the current invention versus stored external seeds. This comparison assumes 4096 patterns were generated per seed. FIG. 7 illustrates coverage percentage versus the number of seeds for a design example A having a scan mode with about 50K flops. Curve 710 is coverage for externally stored seeds. Curve 720 is coverage for internally generated seeds. FIG. 8 illustrates coverage percentage versus the number of seeds implements for a design example B having a scan mode with about 32K flops. Curve 810 is coverage for externally stored seeds. Curve 820 is coverage for internally generated seeds.

FIG. 7 shows a coverage drop of 0.65% with 10 seeds using this invention for design A. FIG. 8 shows a coverage drop of 0.56% with 10 seeds using this invention for design B. The coverage for design A is high compared to design B. This is design dependent and not related to the test seed implementation. Note that this relatively minor reduction in test coverage is coupled with a nearly 17 times reduction in implementation area as shown in Table 2.

What is claimed is:

1. A built-in self-test system for field testing an electronic circuit, comprising:
   a shadow register storing a seed;
   a pseudo-random pattern generator connected to said shadow register to receive said seed and generating a new unique pattern each cycle of a built-in self-test clock;
   a phase shifter connected to said pseudo-random pattern generator to receive each generated unique pattern converting a one-dimensional stream of said pseudo-random patterns into a two dimensional array of values;
   a circuit under test including operational circuits having plural data registers and a plurality of scan chains, each scan chain connecting some of said plural data registers within said operational circuits in a serial chain from a corresponding input to a corresponding output when in a scan test mode, each of said inputs of said plurality of scan chains connected to said phase shifter to receive a corresponding array of values;
   a test data compactor connected to said outputs of each of said plurality of scan chains of said circuit under test to receive data from said plural data registers, said test data compactor compacting said data;
   a multiple-input signature register connected to said test data compactor for storing said compacted data for comparison with an expected internal state;
   seed generation logic connected to said shadow register for supplying a plurality of seeds to said shadow register, said seed generation logic including a finite state machine and generating a next seed from a tied seed and a count of a number of seeds generated; and
   a built-in self-test controller operable for each seed of a plurality of seeds to
      place said circuit under test into said test mode,
      control said shadow register to transfer a seed to said pseudo-random pattern generator to cause said phase shifter to transfer said two dimensional array of values to said circuit under test,
      place said circuit under test in a normal mode and operate for a predetermined interval,
      place said circuit under test in said test mode and transfer data stored in said data registers out of said circuit under test to said test data compacter,
      store said compacted data in said multiple-input signature register,
      compare said stored compacted data to said expected internal standard; and
   said built-in self-test controller is further operable to control said seed generation logic to generate said next seed of a predetermined plurality of seeds.

2. The built-in self-test system of claim 1, wherein:
said seed generation logic generates a first seed from said tied seed.

3. The built-in self-test system of claim 1, wherein:
said seed generation logic generates a first seed from said tied seed.

4. The built-in self-test system of claim 1, wherein:
said seed generation logic includes a linear feedback shift register.

5. The built-in self-test system of claim 1, wherein:
said seed generation logic performs at least the operation of swapping first half bits and second half bits of said seed.

6. The built-in self-test system of claim 1, wherein:
said seed generation logic performs at least the operation of left rotating said seed by one bit position.

7. The built-in self-test system of claim 1, wherein:
said seed generation logic performs at least the operations of Grey coding said seed.

8. The built-in self-test system of claim 1, wherein:
said seed generation logic performs at least the operation of exclusive NORing adjacent bits.

9. The built-in self-test system of claim 1, wherein:
said seed generation logic performs at least the operation of left rotating said seed by two bits.

10. The built-in self-test system of claim 1, wherein:
said seed generation logic performs at least the operation of swapping adjacent bits.

11. The built-in self-test system of claim 1, wherein:
said seed generation logic performs at least the operation of swapping alternate bits.

12. The built-in self-test system of claim 1, wherein:
said seed generation logic performs at least the operation of swapping the $(i+n)^{th}$ bit and $(i+n+2)^{th}$ bit for all n from 0 to half the number of bits of said seed.

13. The built-in self-test system of claim 1, wherein:
said seed generation logic performs at least the operation of swapping alternate bytes of said seed.

* * * * *